(12) United States Patent
Sato et al.

(10) Patent No.: US 11,024,953 B2
(45) Date of Patent: Jun. 1, 2021

(54) ANTENNA-INTEGRATED MODULE AND RADAR DEVICE

(71) Applicant: Panasonic Corporation, Osaka (JP)

(72) Inventors: Junji Sato, Tokyo (JP); Ryosuke Shiozaki, Tokyo (JP)

(73) Assignee: Panasonic Corporation, Osaka (JP)

( * ) Notice: Subject to any disclaimer, the term of this patent is extended or adjusted under 35 U.S.C. 154(b) by 722 days.

(21) Appl. No.: 15/046,933

(22) Filed: Feb. 18, 2016

(65) Prior Publication Data
US 2016/0261036 A1    Sep. 8, 2016

(30) Foreign Application Priority Data

Mar. 3, 2015  (JP) .............................. JP2015-041233

(51) Int. Cl.
*H01Q 1/38* (2006.01)
*G01S 7/03* (2006.01)
(Continued)

(52) U.S. Cl.
CPC .................. *H01Q 1/38* (2013.01); *G01S 7/02* (2013.01); *G01S 7/032* (2013.01); *G01S 7/4026* (2013.01); *H01L 23/66* (2013.01); *H01Q 9/04* (2013.01); *H01Q 21/08* (2013.01); *H01Q 23/00* (2013.01); *G01S 2007/028* (2013.01); *G01S 2007/4013* (2013.01); *H01L 2223/6677* (2013.01); *H01L 2224/04105* (2013.01); *H01L 2224/12105* (2013.01); *H01L 2224/16227* (2013.01);
(Continued)

(58) Field of Classification Search
CPC .......................................................... G01S 7/02

USPC ..................................................... 342/70–72
See application file for complete search history.

(56) References Cited

U.S. PATENT DOCUMENTS

| 5,030,962 A | * | 7/1991 | Rees | ...................... | H01Q 1/247 |
| | | | | | 343/700 MS |
| 5,223,851 A | * | 6/1993 | Hadden | .................. | G01S 13/767 |
| | | | | | 343/873 |

(Continued)

FOREIGN PATENT DOCUMENTS

JP      2013-247493      12/2013

OTHER PUBLICATIONS

M. Wojnowski et al., "A 77-GHz SiGe Single-Chip Four-Channel Transceiver Module with Integrated Antennas in Embedded Wafer-Level BGA Package" Electronic Components and Technology Conference, May 2012, pp. 1027-1032.

*Primary Examiner* — Marcus E Windrich
(74) *Attorney, Agent, or Firm* — Seed IP Law Group LLP (57) ABSTRACT

An antenna-integrated module includes: one or more semiconductor chips each including a silicon substrate, a metal layer stacked on a first surface of the silicon substrate, and one or more frequency converters; an insulating layer that surrounds the one or more semiconductor chips; a re-distribution layer that is stacked on a first surface of the insulating layer and on a first surface of the metal layer; one or more first antenna elements that are provided on the first surface of the metal layer with a first conductor pattern and that are connected to the one or more frequency converters; and one or more second antenna elements that are provided with a second conductor pattern on a first surface of the re-distribution layer stacked on the first surface of the insulating layer and that are connected to the one or more frequency converters.

14 Claims, 10 Drawing Sheets

(51) Int. Cl.
    *H01L 23/66* (2006.01)
    *H01Q 21/08* (2006.01)
    *H01Q 23/00* (2006.01)
    *G01S 7/02* (2006.01)
    *H01Q 9/04* (2006.01)
    *G01S 7/40* (2006.01)
    *H01Q 1/22* (2006.01)

(52) U.S. Cl.
    CPC ............... *H01L 2924/10253* (2013.01); *H01L 2924/1421* (2013.01); *H01Q 1/2283* (2013.01)

(56) References Cited

U.S. PATENT DOCUMENTS

| | | | | |
|---|---|---|---|---|
| 6,100,804 A * | 8/2000 | Brady | ............. | G06K 19/07749 257/678 |
| 7,603,097 B2 * | 10/2009 | Leblanc | ............. | G01S 7/032 342/70 |
| 7,830,301 B2 * | 11/2010 | Margomenos | ............. | G01S 7/03 342/175 |
| 8,022,861 B2 * | 9/2011 | Margomenos | ............. | G01S 7/032 342/175 |
| 8,564,477 B2 * | 10/2013 | Sagala | ............. | G01S 7/032 342/104 |
| 8,760,342 B2 * | 6/2014 | Hayata | ............. | G01S 7/032 342/104 |
| 2006/0176211 A1 * | 8/2006 | Mohamadi | ............. | G01S 13/765 342/51 |
| 2008/0001810 A1 * | 1/2008 | Forstner | ............. | G01S 7/032 342/175 |
| 2008/0309581 A1 * | 12/2008 | Fujii | ............. | H01Q 1/2225 343/873 |
| 2012/0256796 A1 * | 10/2012 | Leiba | ............. | H01Q 1/2283 343/702 |
| 2014/0071021 A1 * | 3/2014 | Liu | ............. | H01L 23/5227 343/893 |
| 2014/0110840 A1 * | 4/2014 | Wojnowski | ............. | H01L 23/49822 257/738 |
| 2014/0110841 A1 * | 4/2014 | Beer | ............. | H01L 23/49822 257/738 |
| 2015/0346322 A1 * | 12/2015 | Schmalenberg | ............. | G01S 7/02 342/175 |
| 2016/0072182 A1 * | 3/2016 | Wang | ............. | H01L 23/5227 343/834 |
| 2016/0118353 A1 * | 4/2016 | Ahrens | ............. | H01L 23/66 257/659 |

* cited by examiner

ANTENNA-INTEGRATED MODULE AND RADAR DEVICE

BACKGROUND

1. Technical Field

The present disclosure relates to a module structure in a wireless communication device such as a mobile terminal or a radar device. For example, the present disclosure relates to a small module in which a radio-frequency circuit and an antenna are integral with each other in a millimeter-wave band and to a radar device including the small module.

2. Description of the Related Art

There have been attempts to achieve integration in a wireless communication device or a radar device using a millimeter-wave for the purpose of reducing the size of a module including an antenna and a radio-frequency circuit.

For example, M. Wojnowski, "A 77-GHz SiGe Single-Chip Four-Channel Transceiver Module with Integrated Antennas in Embedded Wafer-Level BGA Package," Electronic Components and Technology Conference, May. 2012, pp. 1027-1032 (hereinafter referred to as Non-Patent Literature 1) discloses an antenna-integrated module in which a surrounding region of a semiconductor chip is expanded by using an insulating material layer, and an array antenna made up of a plurality of antenna elements is disposed in the expanded region.

However, the conventional technique of Non-Patent Literature 1 necessitates providing, on the semiconductor chip, the same number of external terminals for connection with the antenna elements disposed in the expanded region as the number of antenna elements. This leads to a risk of an increase in size of the semiconductor chip.

SUMMARY

One non-limiting and exemplary embodiment provides an antenna-integrated module in which a plurality of antenna elements can be disposed without increasing the size of a semiconductor chip, and a radar device including the antenna-integrated module.

In one general aspect, the techniques disclosed here feature an antenna-integrated module including: one or more semiconductor chips each having a silicon substrate, a metal layer stacked on a first surface of the silicon substrate, and one or more frequency converters; an insulating layer that surrounds the one or more semiconductor chips; a re-distribution layer that is stacked on a first surface of the insulating layer and on a first surface of the metal layer; one or more first antenna elements that are provided on the first surface of the metal layer with a first conductor pattern and that are connected to the one or more frequency converters; and one or more second antenna elements that are provided with a second conductor pattern on a first surface of the re-distribution layer stacked on the first surface of the insulating layer and that are connected to the one or more frequency converters.

According to the present disclosure, it is possible to dispose a plurality of antenna elements without increasing the size of a semiconductor chip.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

First, underlying knowledge forming the basis of the present disclosure is described. The present disclosure relates to a small module in which a radio-frequency circuit and an antenna are integral with each other in a millimeter-wave band.

To reduce the size of a module in which a radio-frequency circuit and an antenna are integral with each other, the radio-frequency circuit is formed on a semiconductor chip at low cost, for example, by integration using a CMOS process, and the antenna is formed on a PCB (Printed Circuit Board).

It is conventionally general to provide a module in which a radio-frequency circuit and an antenna are integral with each other by mounting an integrated semiconductor chip on a PCB on which an antenna is formed.

However, the method of separately producing an integrated semiconductor chip and an antenna and mounting the integrated semiconductor chip on a PCB on which the antenna is formed has a risk of an increase in production cost, a decrease in reliability caused by the implementation, and an increase in connection loss between the semiconductor chip and the antenna caused by a implementation variation.

Japanese Unexamined Patent Application Publication No. 2013-247493 (hereinafter referred to as Patent Literature 1) discloses an arrangement in which a radio-frequency circuit and a patch antenna are formed on the same semiconductor substrate.

Figure 1:
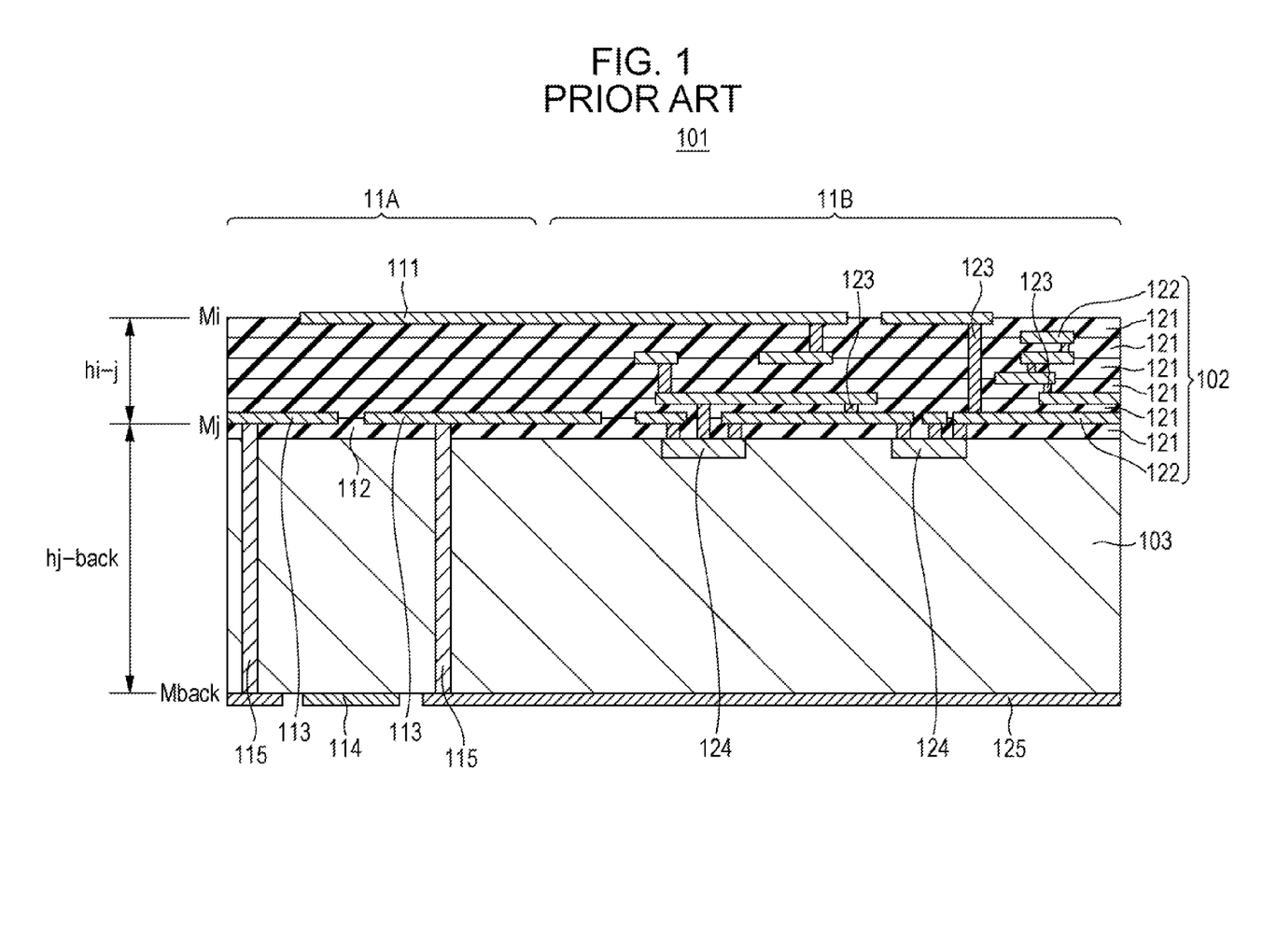
FIG. 1 is a cross-sectional view illustrating a configuration of a semiconductor chip including an integrated patch antenna disclosed in Patent Literature 1.

FIG. 1 is a cross-sectional view illustrating a configuration of a semiconductor chip 101 including an integrated patch antenna described in Patent Literature 1. In FIG. 1, the semiconductor chip 101 including the integrated patch antenna is constituted by an antenna portion 11A and a radio-frequency circuit portion 11B that are formed on an identical semiconductor substrate 103.

The semiconductor chip 101 includes the semiconductor substrate 103, a multilayer distribution portion 102 made up of a plurality of insulating layers 121 and a plurality of metal distribution layers 122 that are stacked on the semiconductor substrate 103, and a grounded conductor 125.

In the antenna portion 11A, a feeder line 111 and a grounded conductor 113 are disposed in metal layers Mi and Mj, respectively, so as to form a microstrip line, and a slot 112 is provided as a primary radiation source in a specific region overlapping the feeder line 111 in the grounded conductor 113.

Furthermore, a radiator 114 is provided in a metal layer 11/back on a surface of the semiconductor substrate 103 opposite to the multilayer distribution portion 102. The radiator 114 can operate as a patch antenna in a desired frequency band by adjusting the radiator 114 to a desired resonant frequency.

In a case where the semiconductor substrate 103 is thick, an electromagnetic wave also diffuses in an in-plane direction of the semiconductor substrate 103, resulting in loss. In view of this, metal TSVs (Through-Silicon Vias) 115 are provided around the radiator 114 at intervals that are equal to or less than ¼ of the wavelength of the electromagnetic wave in the semiconductor substrate 103. The presence of the TSVs 115 inhibits unnecessary diffusion of an electromagnetic wave.

In the radio-frequency circuit portion 11B, a transistor 124 is formed on the semiconductor substrate 103, and a radio-frequency circuit is realized by using lines of the metal layers and metal vias 123 that connect the metal layers and the transistor 124.

According to such a configuration, the microstrip line made up of the feeder line 111 and the grounded conductor 113 is provided on the semiconductor substrate 103 shared by the radio-frequency circuit portion 11 B by using the metal distribution layers 122 shared by the radio-frequency circuit portion 11 B. Furthermore, the antenna portion 11A in which the slot 112 is provided as a primary radiation source in a specific portion facing the feeder line 11 in the grounded conductor 113 and the radiator 114 is formed on a rear surface of the semiconductor substrate 103 is provided. This allows the radio-frequency circuit and the patch antenna to be produced together.

However, in the configuration of Patent Literature 1, the semiconductor substrate 103 generally has large loss in a radio-frequency band, and it is difficult to obtain high gain in the case of an on-chip antenna such as an integrated patch antenna.

Furthermore, in a case where an array antenna is provided by disposing a plurality of antennas on the semiconductor substrate 103, it is necessary to increase the size of the semiconductor chip 101 in accordance with the size and the number of antennas. This leads to an increase in cost.

In general, antennas that constitute an array antenna are disposed at intervals of ½ of the free space wavelength. For example, in a case where an array antenna is provided by aligning four 80 GHz antenna elements, the antenna elements are disposed at intervals of approximately 1.9 mm. This makes it necessary to set the length of a side of the semiconductor chip 101 to 6 mm or longer in consideration of the size of the antenna elements.

Non-Patent Literature 1 discloses another arrangement in which a surrounding region of a semiconductor chip is expanded by using an insulating material layer and an array antenna is disposed in the expanded region.

Figure 2:
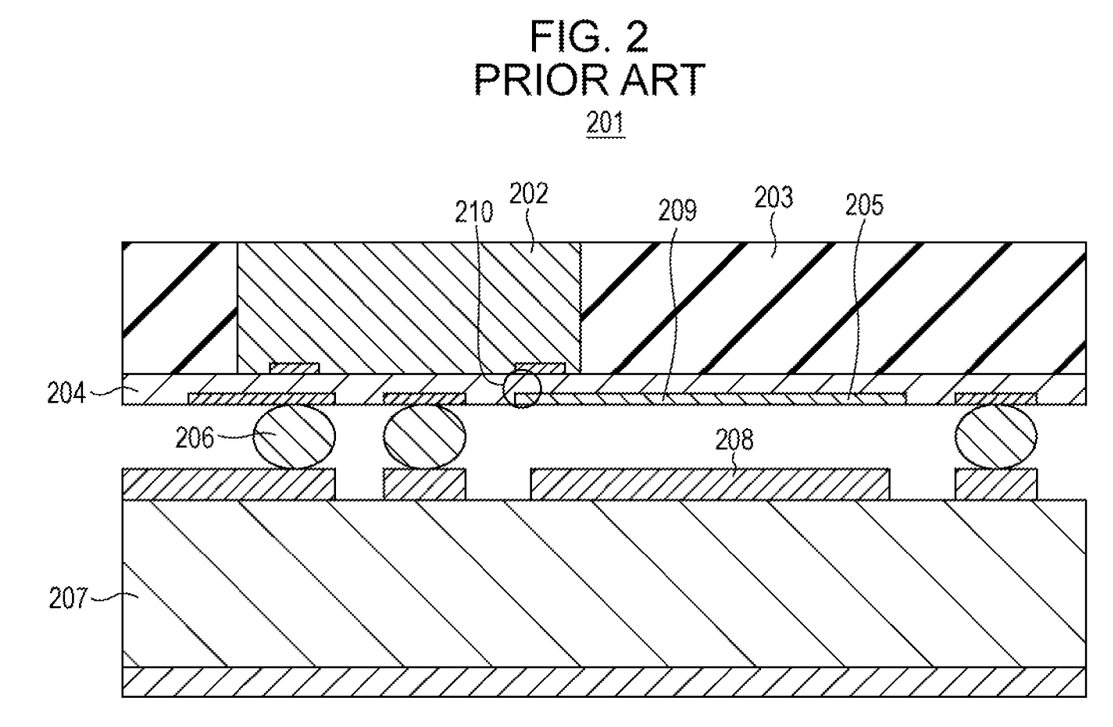
FIG. 2 is a cross-sectional view illustrating an outline structure of an antenna-integrated module disclosed in Non-Patent Literature 1.

FIG. 2 is a cross-sectional view illustrating an outline structure of an antenna-integrated module 201 disclosed in Non-Patent Literature 1. In FIG. 2, the antenna-integrated module 201 includes a MMIC (Monolithic Microwave Integrated Circuit) chip 202, an insulating material layer 203 provided so as to expand a surrounding region of the MMIC chip 202, a re-distribution layer 204, and an antenna 205.

In the antenna-integrated module 201, the re-distribution layer 204 is provided on a module in which the surrounding region of the MMIC chip 202 is expanded by the insulating material layer 203. The antenna 205 and a wiring 209 whose one end is connected to the antenna 205 are provided in the re-distribution layer 204. The other end of the wiring 209 is connected to an external terminal 210 provided on the MMIC chip 202.

Figure 3:
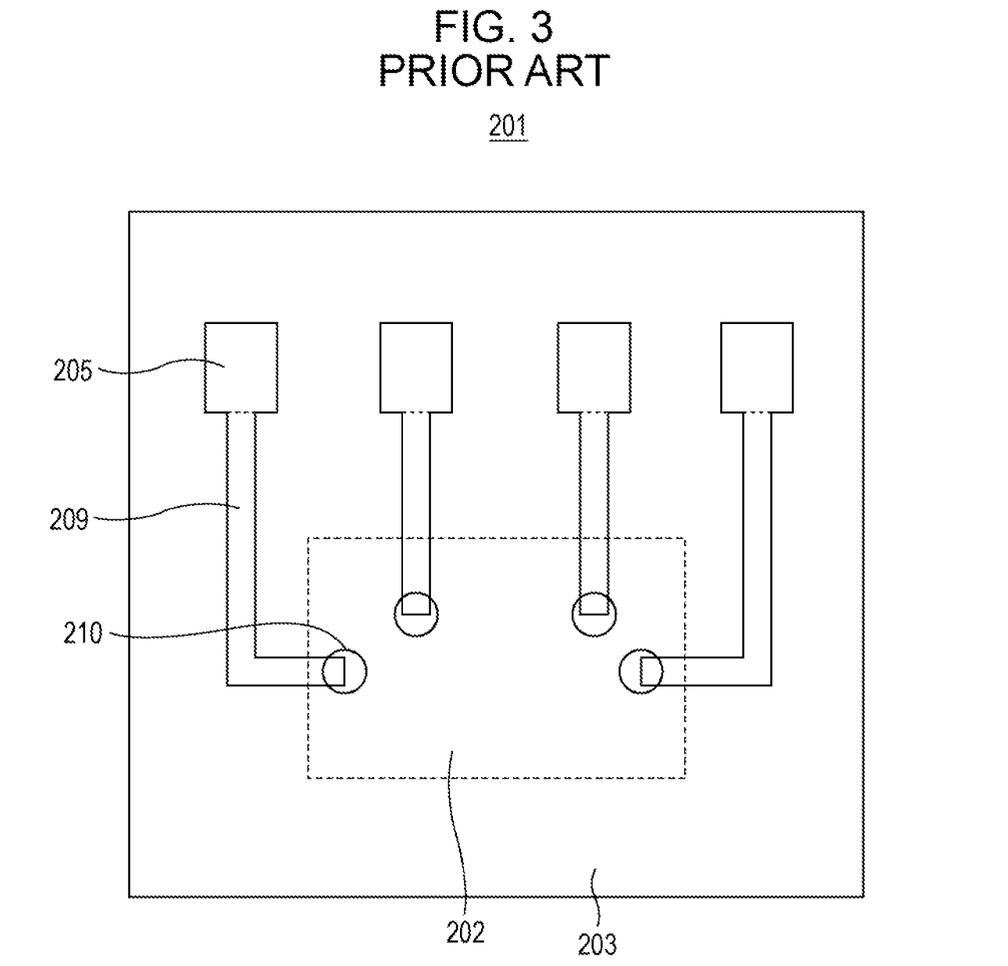
FIG. 3 is a plan view illustrating an outline structure of the antenna-integrated module disclosed in Non-Patent Literature 1.

The antenna-integrated module 201 is mounted on a PCB 207 via solder balls 206. A reflection plate 208 made of a copper foil is patterned on a surface of the PCB 207 that faces the antenna 205, thereby making the antenna 205 unidirectional, FIG. 3 is a plan view illustrating an outline structure of the antenna-integrated module 201 disclosed in Non-Patent Literature 1. Specifically, FIG. 3 is a view obtained when the structure of FIG. 2 is viewed from the side on which the re-distribution layer 204 is provided. The antenna 205 formed by using the re-distribution layer 204 is provided not on the MMIC chip 202 but on the expanded insulating material layer 203.

According to the configuration illustrated in FIGS. 2 and 3, it is possible to obtain a module integrating the antenna 205 without increasing the size of the MMIC chip 202. Furthermore, because of the arrangement in which the antenna 205 is provided on the insulating material layer 203, the antenna 205 can have higher gain than that in an arrangement in which the antenna 205 is provided on the MMIC chip 202.

However, according to the configuration of the antenna-integrated module 201 of Non-Patent Literature 1, the wiring 209 that connects the antenna 205 and the MMIC chip 202 is long, resulting in large loss.

Furthermore, according to the arrangement in which the antenna-integrated module 201 is mounted on the PCB 207, it is difficult to dispose the solder balls 206 in regions where the antenna 205 and the wiring 209 are provided. This restricts a region where the solder balls 206 are disposed.

That is, it is difficult to obtain reliability in mounting the antenna-integrated module 201, Furthermore, in a case where an array antenna is provided by disposing a plurality of antennas, the number of external terminals 210 increases in accordance with the number of antennas. As a result, the size of the MMIC chip 202 becomes large.

In view of such circumstances, the present disclosure was accomplished by focusing on positions at which antenna elements are disposed in an antenna-integrated module in which a semiconductor chip and a plurality of antenna elements disposed on an insulating material layer expanding a surrounding region of the semiconductor chip are provided.

Embodiments of the present disclosure are described in detail below with reference to the drawings. Note that the embodiments below are examples, and the present disclosure is not limited to these embodiments.

Embodiment 1

Figure 4A:
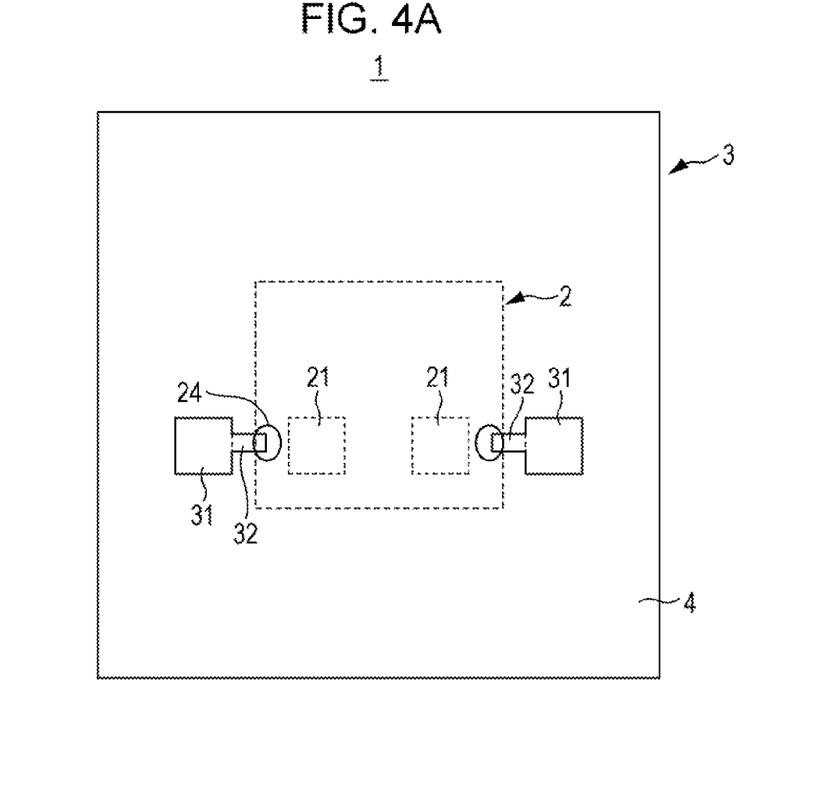
FIG. 4A is a top view illustrating an outline configuration of an antenna-integrated module according to Embodiment 1 of the present disclosure.
Figure 4B:
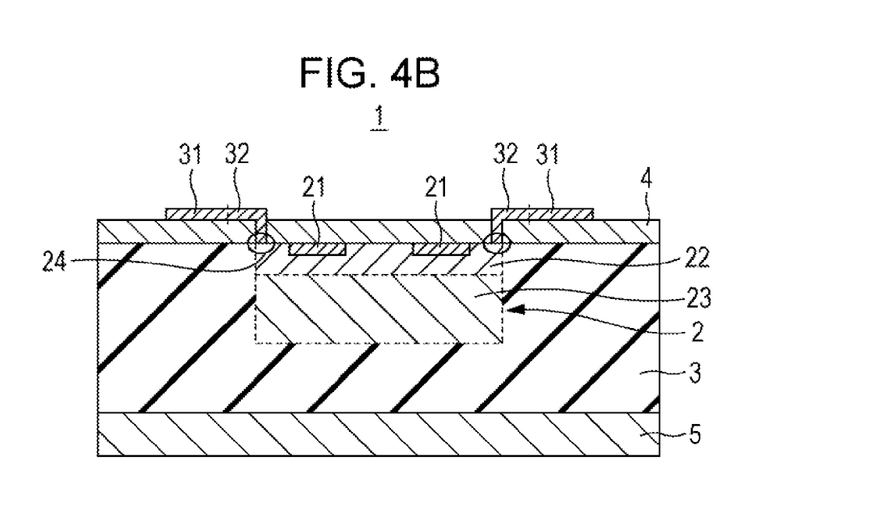
FIG. 4B is a cross-sectional view illustrating an outline configuration of the antenna-integrated module according to Embodiment 1 of the present disclosure.

FIG. 4A is a top view illustrating an outline configuration of an antenna-integrated module 1 according to Embodiment 1 of the present disclosure. FIG. 4B is a cross-sectional view illustrating an outline configuration of the antenna-integrated module 1 according to Embodiment 1 of the present disclosure.

As illustrated in FIGS. 4A and 4B, the antenna-integrated module 1 includes a semiconductor chip 2, an insulating layer 3, a re-distribution layer 4, and a conductor plate 5.

The semiconductor chip 2 includes two first antenna elements 21, a metal layer 22, a silicon substrate 23, and external terminals 24, and a radio-frequency circuit 6 (see FIG. 5) that is a frequency converter is mounted on the semiconductor chip 2.

The first antenna elements 21 are on-chip antennas formed from a conductive pattern on the metal layer 22 and are spaced away from each other by a predetermined interval. The metal layer 22 is stacked on one of surfaces of the silicon substrate 23. On the metal layer 22, an internal wiring for connection with a transistor and the like included in the silicon substrate 23 and the external terminal 24 are provided. The silicon substrate 23 is a semiconductor substrate including the transistor and the like. The external terminals 24 are terminals for connection with second antenna elements 31 (described later) provided on the re-distribution layer 4.

The insulating layer 3 is provided so as to surround the semiconductor chip 2 except for the side on which the metal layer 22 is stacked and to expand a surface of the metal layer 22. The re-distribution layer 4 is stacked on the surface of the metal layer 22 and a surface of the insulating layer 3 that is provided so as to expand the surface of the metal layer 22.

That is, in the antenna-integrated module 1, the semiconductor chip 2 is embedded in the insulating layer 3 and the re-distribution layer 4.

The two second antenna elements 31 and wirings 32 are formed from a conductive pattern on the re-distribution layer 4. The second antenna elements 31 are provided on the re-distribution layer 4 so as to be located above the insulating layer 3 when viewed in the top view illustrated in FIG. 4A. The two second antenna elements 31 are provided on the substantially same line as the two first antenna elements 21 so as to sandwich the first antenna elements 21. The two second antenna elements 31 are spaced away from the respective two first antenna elements 21 by a predetermined interval.

The wirings 32 are metal patterns that are integral with the second antenna elements 31. Ends of the wirings 32 that are not in contact with the second antenna elements 31 are electrically connected to the external terminals 24 provided on the metal layer 22.

The conductor plate 5 is provided on a surface of the insulating layer 3 that is opposite to the surface on which the re-distribution layer 4 is provided.

Figure 5:
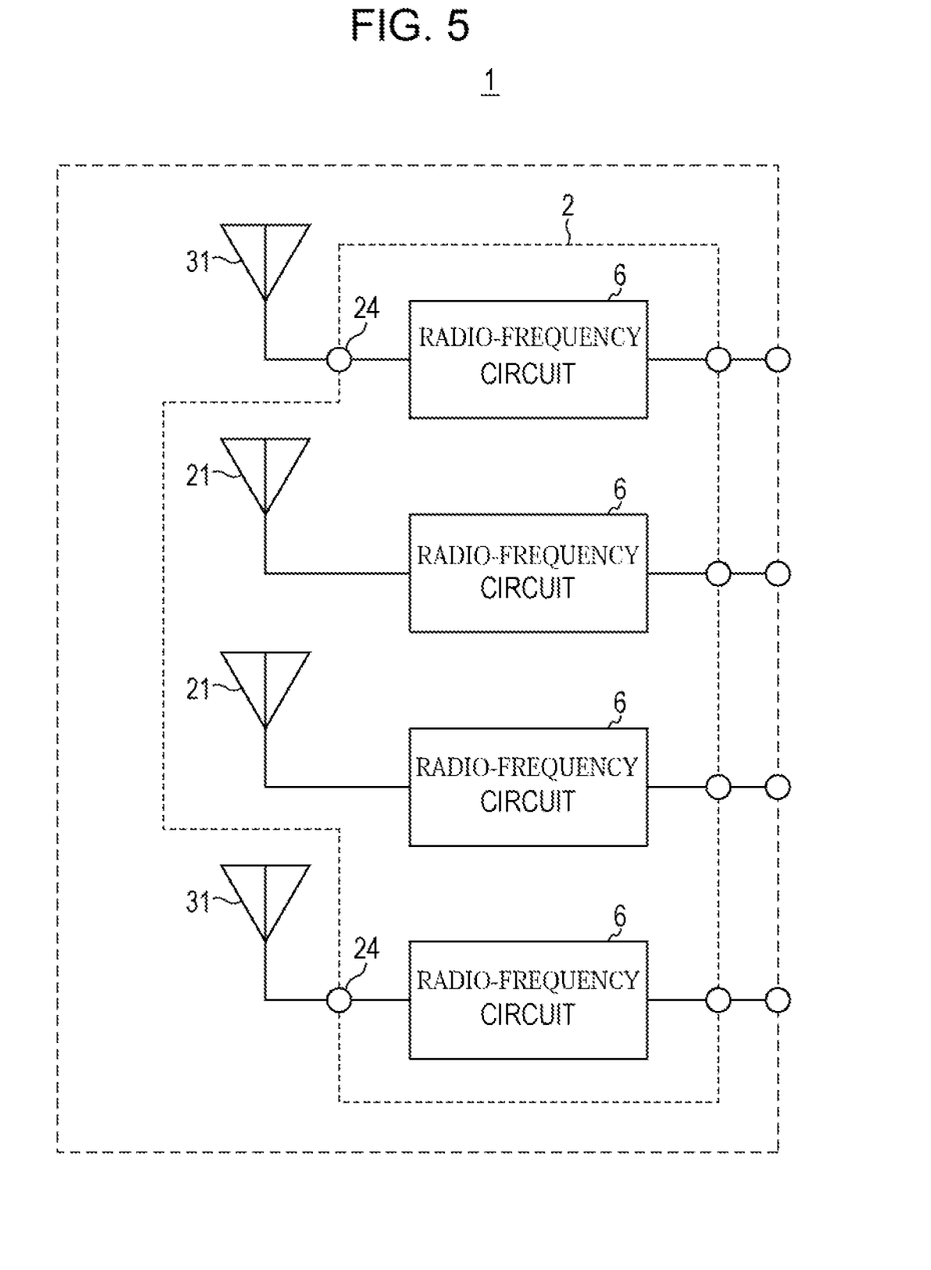
FIG. 5 illustrates functional blocks of the antenna-integrated module according to Embodiment 1 of the present disclosure.

Next, functional blocks of the antenna-integrated module 1 are described. FIG. 5 is a diagram illustrating the functional blocks of the antenna-integrated module 1 according to Embodiment 1 of the present disclosure.

The antenna-integrated module 1 has four radio-frequency circuits 6 within the semiconductor chip 2. The radio-frequency circuits 6 are realized by amplifiers, mixers, or the like (not illustrated).

Two out of the four radio-frequency circuits 6 are connected to the respective two first antenna elements 21 provided on the metal layer 22. Since the first antenna elements 21 are provided on the metal layer 22 of the semiconductor chip 2, there is no terminal connecting the radio-frequency circuits 6 and the first antenna elements 21. According to this arrangement, it is possible to suppress connection loss between the radio-frequency circuits 6 and the first antenna elements 21.

The remaining two that are not connected to the first antenna elements 21 out of the four radio-frequency circuits 6 are connected to the respective two second antenna elements 31 provided on the re-distribution layer 4. Since the second antenna elements 31 are provided on the re-distribution layer 4 so as to be located outside the semiconductor chip 2, the external terminals 24 connecting the radio-frequency circuits 6 included in the semiconductor chip 2 and the second antenna elements 31 exist.

Assume that FIG. 5 illustrates a transmission module used in a transmission device, a signal input to the semiconductor chip 2 is radiated from the first antenna elements 21 and the second antenna elements 31 via the four radio-frequency circuits 6. Assume that FIG. 5 illustrates a reception module used in a reception device, the signal flow is opposite to that in the case of a transmission module.

In a case where an array antenna is provided by connecting an antenna element to each of the four radio-frequency circuits 6, a high gain antenna structure in which an unnecessary radiation component is suppressed is obtained by setting an interval between the antenna elements to the length that is substantially the same as the wavelength of a transmission signal.

For example, a half wavelength in a free space in a 80 GHz band is substantially 1.9 mm. In a case where an array antenna made up of an array of four antenna elements is provided, the length of 6 mm or longer is needed in a direction in which the antenna elements are disposed in consideration of the size of each antenna. In a case where all of the four antenna elements are provided on the semiconductor chip 2, the chip size becomes large, and the production cost becomes high.

Meanwhile, in a case where the four antenna elements are provided not on the semiconductor chip 2 but on the re-distribution layer 4 in order to suppress the production cost, a wiring from the semiconductor chip 2 to each antenna element becomes long, and accordingly connection loss with each antenna element becomes large. Furthermore, in a case where the four antenna elements are provided on the re-distribution layer 4, four external terminals for connection with the antenna elements need be provided on the semiconductor chip 2.

In the present embodiment, two antenna elements are provided on the semiconductor chip 2, and the remaining two antenna elements are provided outside the semiconductor chip 2. This allows the size of the semiconductor chip 2 to be suppressed to approximately 3 mm on a side. With the arrangement, it is possible to suppress the production cost without increasing the size of the semiconductor chip 2. Furthermore, since the length of a wiring from the semiconductor chip 2 to each antenna element can be made short, it is also possible to suppress connection loss with each antenna element. Furthermore, it is possible to keep the number of external terminals connecting the semiconductor chip 2 and the antenna elements down to two.

Furthermore, according to the arrangement, the areas of the second antenna elements 31 and the wirings 32 on the re-distribution layer 4 can be made small.

Figure 6A:
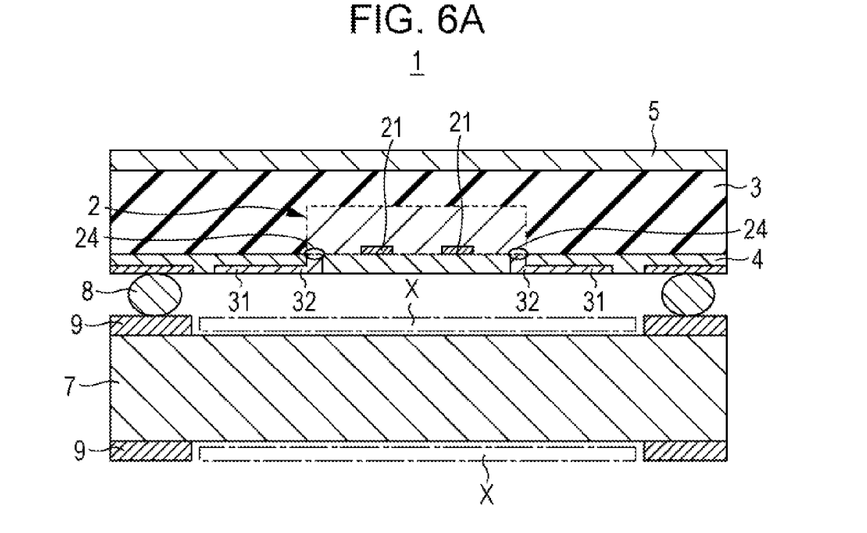
FIG. 6A is a cross-sectional view illustrating a way in which the antenna-integrated module according to Embodiment 1 of the present disclosure is mounted.
Figure 6B:
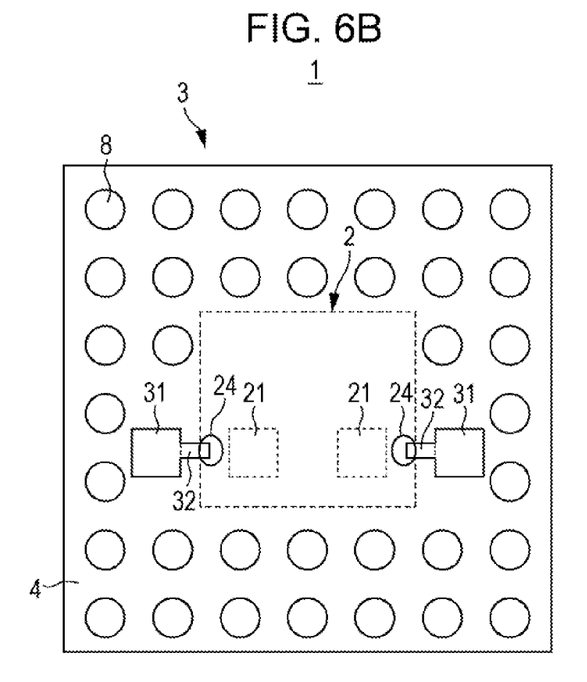
FIG. 6B is a plan view illustrating a way in which the antenna-integrated module according to Embodiment 1 of the present disclosure is mounted.

Next, a way in which the antenna-integrated module 1 described above is mounted is described. The following describes a way in which the antenna-integrated module 1 is mounted as a BGA package on a PCB by using solder balls. FIG. 6A is a cross-sectional view illustrating a way in which the antenna-integrated module according to Embodiment 1 is mounted, and FIG. 6B is a plan view illustrating a way in which the antenna-integrated module according to Embodiment 1 is mounted. FIG. 6B is a plan view obtained in a case where the structure of FIG. 6A is viewed from the side on which the re-distribution layer 4 is provided.

As illustrated in FIGS. 6A and 6B, the antenna-integrated module 1 is mounted on the PCB 7 by using the solder balls 8 and a conductor pattern 9.

In a case where the antenna-integrated module 1 is mounted as a BGA package, it is necessary to increase the number of solder balls 8 in order to improve the reliability. In the present embodiment, since the areas of the second antenna elements 31 and the wirings 32 are kept small, it is possible to increase the number of solder balls 8 as illustrated in FIG. 6B, thereby improving the reliability of mounting.

Furthermore, in the case illustrated in FIGS. 6A and 6B, the conductor pattern 9 is provided in portions of each surface of the PCB 7 except for portions X facing the first antenna elements 21 and the second antenna elements 31. With the arrangement, the conductor plate 5 operates as a reflection plate reflecting a radio wave radiated from the first antenna elements 21 and the second antenna elements 31. This allows the radio wave to be radiated so as to pass through the PCB 7.

In a millimeter-wave band, both ends of a terminal for outputting a signal to an element that is outside a semiconductor chip need be surrounded by a ground terminal in a case where a in order to suppress connection loss between elements. Accordingly, two ground terminals are needed in order to output a signal in a millimeter-wave band to a single external element. That is, as the number of external terminals 24 becomes larger, the number of ground terminals provided on the semiconductor chip 2 becomes larger and the size of the semiconductor chip 2 becomes larger.

In the present embodiment, some of a plurality of antenna elements are provided on the semiconductor chip 2. This allows the number of external terminals for output from the semiconductor chip 2 to an outside such as the re-distribution layer 4 to be kept small.

As described above, according to the present embodiment, antenna elements of an array antenna can be disposed at predetermined intervals (e.g., intervals equivalent to a half wavelength) without increasing the size of the semiconductor chip 2. Furthermore, the gain of the array antenna can be made high by making a wiring for connection with each antenna element short and thereby suppressing connection loss.

Furthermore, since the areas of the second antenna elements 31 and the wirings 32 to the second antenna elements 31 on the re-distribution layer 4 can be made small, the reliability of mounting can be improved in a case where the antenna-integrated module 1 is mounted on the PCB 7 by using the solder balls 8, Note that it is desirable that the first antenna elements 21 and the second antenna elements 31 described in the present embodiment have a differential configuration. In a case of a single-end input as in a microstrip antenna used in a millimeter-wave band, ground is needed. However, in the case of a semiconductor chip produced by a method such as a CMOS process, it is difficult to provide ideal ground such as a planar conductor although a mesh-shaped conductor can be provided. In a case where antenna elements are provided by using the re-distribution layer 4 like the second antenna elements 31, ideal ground can be provided in the re-distribution layer 4, but it is difficult to obtain a broadband antenna characteristic because the re-distribution layer 4 is generally thin (several tens of urn) and thus the distance between the antenna elements and the ground is close, In the present embodiment, since antenna elements have a differential configuration, ideal ground is not needed. This makes it possible to keep the influence of the ground on the antennas low, thereby making the antenna elements tolerant of an environmental fluctuation. Examples of antenna elements having a differential configuration include dipole antennas and loop antennas.

Furthermore, in the present embodiment, since the conductor plate 5 is used as a reflection plate, unidirectional antennas using the reflection plate can be provided. This makes it possible to improve the antenna gain of the antenna-integrated module.

Embodiment 2

Next, Embodiment 2 of the present disclosure is described. A structure of an antenna-integrated module 1 according to the present embodiment is similar to that described with reference to FIGS. 4A and 4B, and description thereof is omitted.

Figure 7:
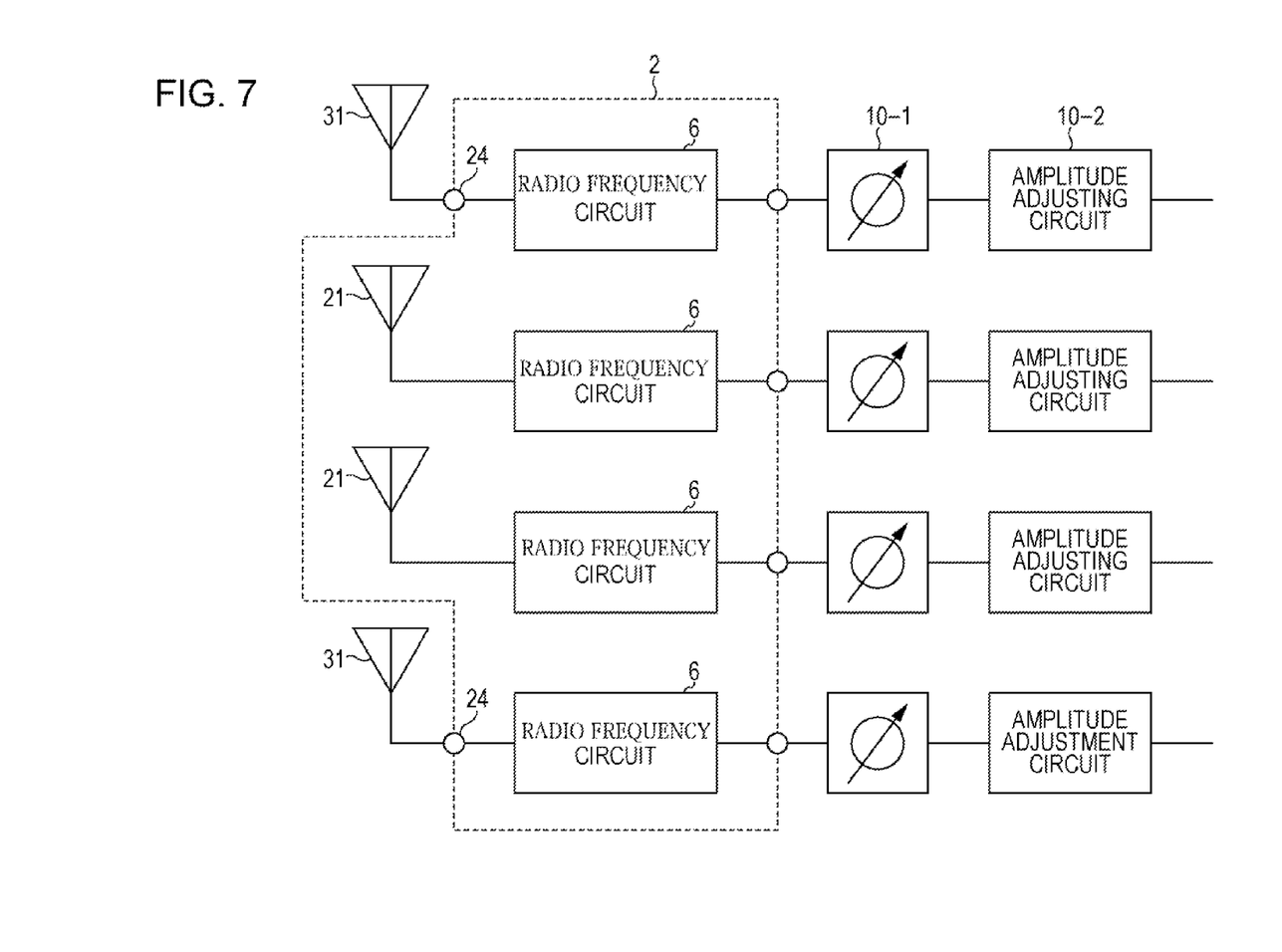
FIG. 7 illustrates functional blocks of the antenna-integrated module according to Embodiment 2 of the present disclosure.

FIG. 7 is a diagram illustrating functional blocks of a communication device including the antenna-integrated module 1 according to Embodiment 2. In FIG. 7, functional blocks that are identical to those in FIG. 5 are given identical reference signs, and description thereof is omitted. The configuration of FIG. 7 is obtained by adding phase adjusting circuits 10-1 and amplitude adjusting circuits 10-2 to the configuration of FIG. 5. The functional blocks of the communication device including the antenna-integrated module 1 include the phase adjusting circuits 10-1 connected to radio-frequency circuits 6 included in the semiconductor chip 2 and the amplitude adjusting circuits 10-2.

The phase adjusting circuits 10-1 are circuits for adjusting the phase of an input signal, and the amplitude adjusting circuits 10-2 are circuits for adjusting the amplitude of an input signal.

The communication device according to the present embodiment can be provided, for example, by mounting an antenna-integrated module 1 on a PCB 7 by using solder balls 8 as illustrated in FIGS. 6A and 6B. In this case, the phase adjusting circuits 10-1 and the amplitude adjusting circuits 10-2 are included in the PCB 7. Note that the phase adjusting circuits 10-1 and the amplitude adjusting circuits 10-2 may be included in the semiconductor chip 2 of the antenna-integrated module 1.

In the antenna-integrated module 1 of Embodiment 1, the first antenna elements 21 and the second antenna elements 31 are disposed on different planes in a vertical direction (thickness direction) of the antenna-integrated module 1. Accordingly, a phase difference between the first antenna elements 21 and the second antenna elements 31 is determined on the basis of a radio wave radiation direction and a difference in the vertical direction between the planes on which the antenna elements are disposed.

Furthermore, in the antenna-integrated module 1 of Embodiment 1, since the configuration of the first antenna elements 21 is different from that of the second antenna elements 31, the amplitude of an output signal or an input signal of the first antenna elements 21 is different from that of the second antenna elements 31.

In the present embodiment, the phase adjusting circuits 10-1 and the amplitude adjusting circuits 10-2 are connected to the radio-frequency circuits 6. With the arrangement, the amplitude and phase of a signal that is input or output to the four radio-frequency circuits 6 are adjusted.

Figure 8A:
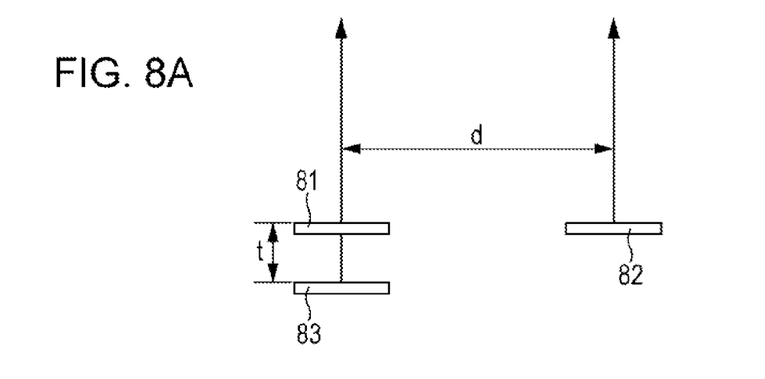
FIG. 8A illustrates an example of a phase difference between antenna systems of the antenna-integrated module.
Figure 8B:
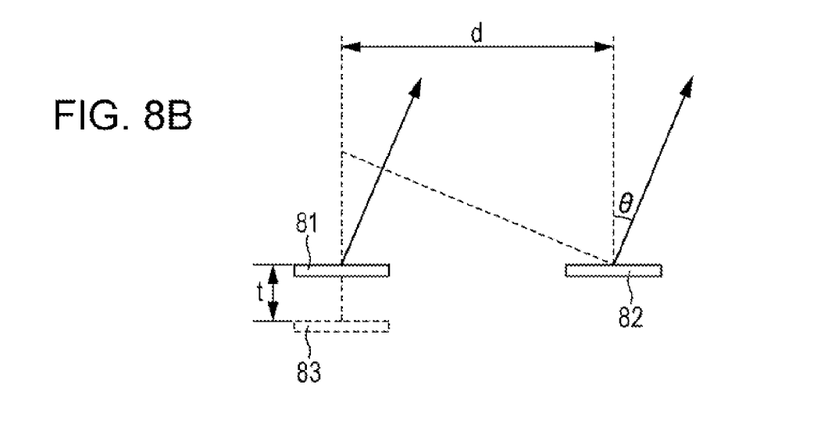
FIG. 8B illustrates an example of a phase difference between antenna systems of the antenna-integrated module.
Figure 8C:
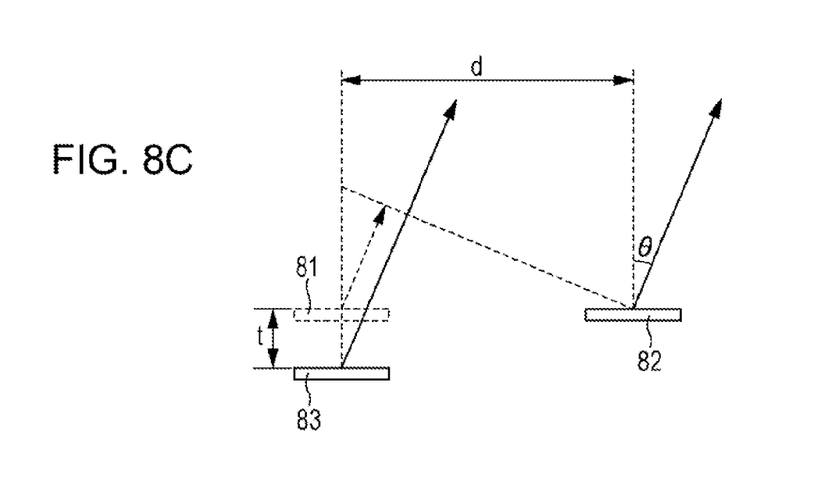
FIG. 8C illustrates an example of a phase difference between antenna systems of the antenna-integrated module.

Phase adjustment in the communication device of the present embodiment is described. FIGS. 8A through 8C are diagrams illustrating an example of a phase difference between antenna systems of the antenna-integrated module 1. FIG. 8A is a diagram illustrating a phase difference between antenna systems in a direction vertical to planes on which the antennas are provided (a direction in which the antennas face). FIG. 8B is a diagram illustrating a phase difference between antenna systems in a direction inclined with respect to the direction in which the antennas face in a case where the antenna elements are provided on an identical plane. FIG. 8C is a diagram illustrating a phase difference between antenna systems in the inclined direction in a case where the antenna elements are provided on different planes.

In FIGS. 8A through 8C, the interval d is an interval between the antenna elements, and the distance t is a difference in the vertical direction between the planes on which the antenna elements are disposed. Note that a case where an antenna element 81 and an antenna element 82 are combined is a case where the antenna elements are provided on an identical plane. Note also that an antenna element 83 and the antenna element 82 correspond to the first antenna element 21 and the second antenna element 31, respectively, and a case where the antenna element 83 and the antenna element 82 are combined is a case where the antenna elements are provided on different planes.

In the following description, it is assumed that the communication device of the present embodiment is a transmission device that radiates a radio wave from each antenna element. In a case where the communication device of the present embodiment is a reception device that receives a radio wave from each antenna element, the term "antenna radiation direction" in the following description is replaced with the term "antenna reception direction".

As indicated by the antenna element 81 and the antenna element 82 in FIG. 8A, the phase difference between the antenna elements is zero in a case where an antenna radiation direction is the direction in which the antenna elements face and where the antenna elements are disposed in an identical plane. Meanwhile, as indicated by the antenna element 83 and the antenna element 82 in FIG. 8A, the phase of the antenna element 83 and the phase of the antenna element 82 differ by the distance t in the direction in which the antenna elements face in a case where the antenna elements are disposed in different planes. That is, in a case where antenna elements are disposed in different planes, the phase adjusting circuits 10-1 adjust the phases in consideration of the distance t.

As indicated by the antenna element 81 and the antenna element 82 in FIG. 8B, a phase difference between antenna elements is $d \times \sin°$ in a case where an antenna radiation direction is inclined with respect to the direction in which the antenna elements face at an angle 0 and where the antenna elements are disposed on an identical plane.

Meanwhile, as indicated by the antenna element 83 and the antenna element 82 in FIG. 8C, a phase difference between antenna elements is $d \times \sin\theta + t \times \cos\theta$ in a case where an antenna radiation direction is inclined with respect to the direction in which the antenna elements face at an angle $\theta$ and where the antenna elements are disposed on different planes. That is, the phase adjusting circuits 10-1 adjust the phases by also considering the phase of $t \times \cos°$ in a case where the antenna elements are disposed on different planes.

Next, amplitude adjustment in the communication device of the present embodiment is described. As described above, the first antenna elements 21 are provided on the semiconductor chip 2, and the second antenna elements 31 are provided on the re-distribution layer 4. Therefore, the antenna elements are made of different materials and are different in gain.

The amplitude adjusting circuits 10-2 adjust the amplitude while considering the difference in gain between the antenna elements. For example, in a case where the gain of the first antenna elements 21 is smaller than that of the second antenna elements 31, the amplitude adjusting circuits 10-2 connected to the first antenna elements 21 increase the amplitude of a signal supplied to the first antenna elements 21 so that the amplitude of a radio wave radiated from the first antenna elements 21 matches that of a radio wave radiated from the second antenna elements 31. Alternatively, the amplitude adjusting circuits 10-2 connected to the second antenna elements 31 may reduce the amplitude of a signal supplied to the second antenna elements 31.

For example, in a case where a reception device that has an array antenna estimates an arrival direction from received radio waves, the reception device estimates the arrival direction while shifting the phases of the signals received by antenna elements. In this case, it is desirable that there is no difference among the amplitudes and phases of the radio waves radiated from antenna elements of an array antenna of a transmission device. Since the communication device of the present embodiment includes the phase adjusting circuits 10-1 and the amplitude adjusting circuits 10-2, the amplitudes and phases of radio waves radiated from the antenna elements can be adjusted to match each other.

In the present embodiment described above, an arrangement in which the phase adjusting circuits 10-1 and the amplitude adjusting circuits 10-2 are provided for the antenna elements has been described. However, the phase adjusting circuits 10-1 and the amplitude adjusting circuits 10-2 may be provided for either the first antenna elements 21 or the second antenna elements 31. This arrangement makes it possible to reduce the number of phase adjusting circuits 10-1 and the number of amplitude adjusting circuits 10-2, thereby reducing the circuit scale.

In the present embodiment described above, an arrangement in which both of the phase adjusting circuits 10-1 and the amplitude adjusting circuits 10-2 are provided has been described. However, the amplitude adjusting circuits 10-2 may be omitted. This arrangement makes it possible to reduce the number of amplitude adjusting circuits 10-2, thereby reducing the circuit scale.

Embodiment 3

In general, first antenna elements 21 that are provided on a CMOS as a semiconductor chip 2 have lower antenna gain than second antenna elements 31 provided on a re-distribution layer 4 and an insulating material 3. This is due to the influence of the conductivity of a silicon substrate in a CMOS, and the like.

For example, in a case where an unnecessary radiation component (side lobe) with respect to main lobe is suppressed in an array antenna made up of the first antenna elements 21 and the second antenna elements 31, a distribution, such as a Taylor distribution, in which the amplitude of a radio wave radiated from the vicinity of the center of the array antenna is made large and the amplitude becomes smaller as the position becomes closer to both ends is generally desirable.

In the present embodiment, a configuration of an antenna-integrated module 1 having a distribution in which the amplitude of a radio wave radiated from the vicinity of the center of the array antenna is made large and the amplitude becomes smaller as the position becomes closer to both ends is described.

Figure 9A:
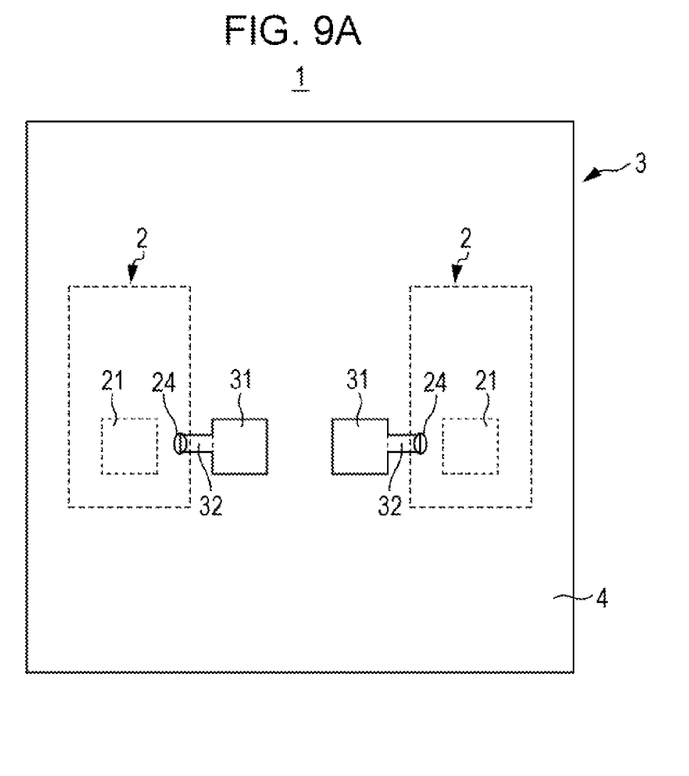
FIG. 9A is a top view illustrating an outline structure of an antenna-integrated module according to Embodiment 3 of the present disclosure.
Figure 9B:
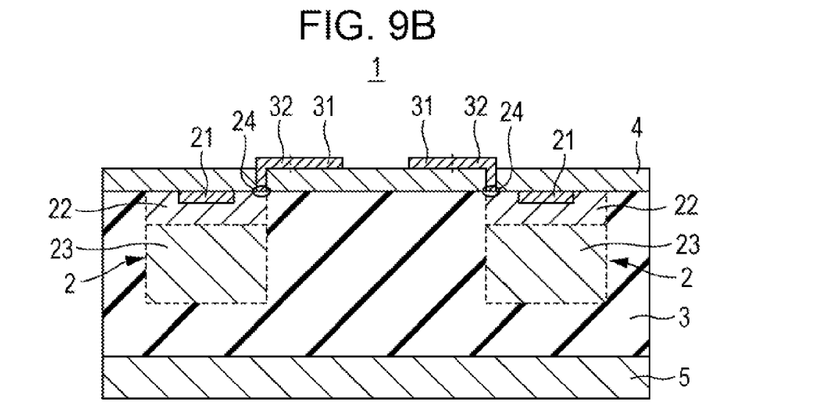
FIG. 9B is a cross-sectional view illustrating an outline structure of the antenna-integrated module according to Embodiment 3 of the present disclosure.

FIG. 9A is a top view illustrating an outline structure of an antenna-integrated module 1 according to Embodiment 3 of the present disclosure. FIG. 9B is a cross-sectional view illustrating an outline structure of the antenna-integrated module 1 according to Embodiment 3 of the present disclosure. Elements that are similar to those in Embodiment 1 are given identical reference signs, and description thereof is omitted. The following describes differences from Embodiment 1.

As illustrated in FIGS. 9A and 9B, the antenna-integrated module 1 has two semiconductor chips 2, and a single first antenna element 21 is provided for each of the semiconductor chips 2. A single external terminal 24 is formed on a metal layer 22 of each of the semiconductor chips 2.

Two second antenna elements 31 are provided on a re-distribution layer 4 so as to be sandwiched between the two semiconductor chips 2. The two second antenna elements 31 are connected to the external terminals 24 provided on the metal layers 22 of the two semiconductor chips 2 via wirings 32.

As illustrated in FIG. 9A, the two second antenna elements 31 are provided on substantially the same line as the two first antenna elements 21 provided on the two semiconductor chips 2 so as to be sandwiched between the first antenna elements 21 when viewed from above. The two second antenna elements 31 are disposed away from the respective two first antenna elements 21 by a predetermined interval.

The array antenna provided in the antenna-integrated module 1 illustrated in FIGS. 9A and 9B is arranged such that the second antenna elements 31 that have relatively high antenna gain are disposed in a central part and the first antenna element 21 that have relatively low antenna gain are disposed at both ends. With the arrangement, it is possible to obtain a distribution, like a Taylor distribution, in which the amplitude of a radio wave radiated from the vicinity of the center of the array antenna is made large and the amplitude becomes smaller as the position becomes closer to both ends. This allows the antenna-integrated module 1 according to the present embodiment to obtain directionality with suppressed side lobe.

In the present embodiment, an arrangement in which two semiconductor chips 2 are provided has been described. However, three or more semiconductor chips may be provided.

In the present embodiment, an arrangement in which a single first antenna element 21 is provided for each of the two semiconductor chips 2 and the two second antenna elements 31 are sandwiched between first antenna elements 21 has been described. However, the number of first antenna elements 21 and the number of second antenna elements 31 are not limited to this.

In a case where a single array antenna is provided by using five or more antenna elements, it is preferable that first antenna elements be disposed at both ends. Even in a case where two or more array antennas are provided, it is preferable that first antenna elements be disposed at both ends of each array.

Embodiment 4

In Embodiment 1, an arrangement in which the conductor plate 5 that is provided on a surface of the insulating layer 3 opposite to a surface on which the re-distribution layer 4 is provided operates as a reflection plate and causes a radio wave to be radiated so as to pass through the PCB 7 has been described. In the present embodiment, an arrangement in which a reflection plate is provided on the PCB 7 instead of the conductor plate 5 and thereby first antenna elements 21 and second antenna elements 31 are made unidirectional.

Figure 10A:
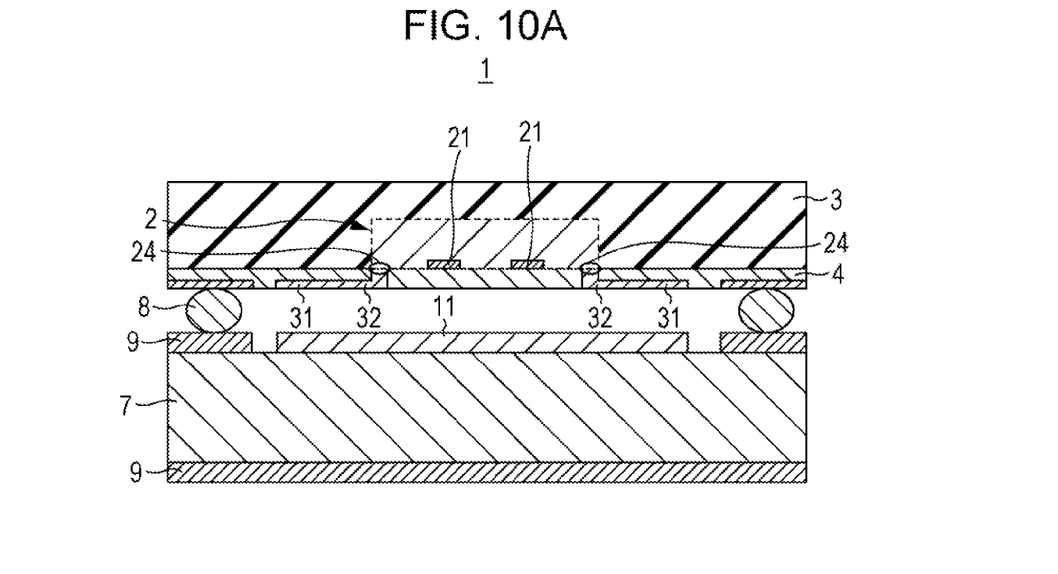
FIG. 10A is a cross-sectional view illustrating a state where an antenna-integrated module according to Embodiment 4 of the present disclosure is mounted.
Figure 10B:
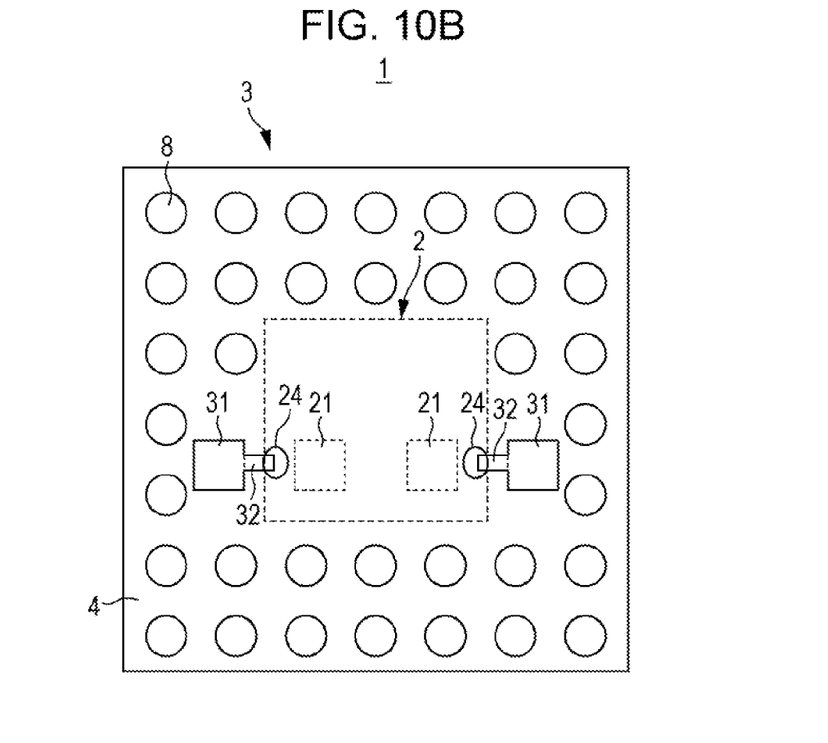
FIG. 10B is a plan view illustrating a state where the antenna-integrated module according to Embodiment 4 of the present disclosure is mounted.

FIG. 10A is a cross-sectional view illustrating a state where an antenna-integrated module according to Embodiment 4 of the present disclosure is mounted. FIG. 10B is a plan view illustrating a state where the antenna-integrated module according to Embodiment 4 of the present disclosure is mounted. Elements that are similar to those in Embodiment 1 are given identical reference signs, and description thereof is omitted. The following describes differences from Embodiment 1.

The antenna-integrated module 1 illustrated in FIG. 10A includes a reflection plate 11 that is provided on a PCB 7 so as to face first antenna elements 21 and second antenna elements 31 instead of the conductor plate 5 illustrated in FIG. 6A, Note that FIG. 10B is a plan view obtained when the structure of FIG. 10A is viewed from the side on which the re-distribution layer 4 is provided, and is similar to the plan view illustrated in FIG. 6B.

In this arrangement, an antenna radiation direction is opposite to the direction passing through the PCB 7 due to the reflection plate 11.

According to the present embodiment described above, since the antenna radiation direction is opposite to the direction passing through the PCB 7, loss caused by a dielectric that constitutes the PCB 7 does not occur. It is therefore possible to provide a radio-gain antenna-integrated module, Note that since the reflection plate 11 is provided on the PCB 7, the gain of antennas can be increased by adjusting the height of solder balls 8 and thereby adjusting the position of the reflection plate 11 so that the interval between each antenna element and the reflection plate 11 becomes optimum, In the present embodiment, an arrangement in which a reflection plate is provided on a top surface of the PCB 7 has been described. However, the present disclosure is not limited to this. For example, it is also possible to employ an arrangement in which a PCB has a plurality of conductor layers including a top layer and an inner layer, and the reflection plate 11 is disposed in the inner layer of the PCB 7 at a position optimum for the first antenna elements 21 and the second antenna elements 31.

In the embodiments described above, an arrangement in which four antenna elements are provided has been described. However, the present disclosure is not limited to this. It is only necessary that an antenna-integrated module including a plurality of antenna elements be arranged such that some of the antenna elements are provided on a metal layer of a semiconductor chip and the remaining antenna elements are provided on a re-distribution layer.

In the embodiments described above, an arrangement in which antenna elements are aligned in a single array has been described. However, antenna elements may be disposed in two or more arrays.

In the embodiments described above, an arrangement in which an antenna-integrated module is mounted on a PCB by using solder balls has been described. However, the way in which the antenna-integrated module is mounted is not limited to this.

Various embodiments have been described above with reference to the drawings. Needless to say, however, the present disclosure is not limited to such examples. It is evident that a person skilled in the art can arrive at various changes and modifications within the scope of the claims, and it is understood that such changes and modifications are also encompassed within the technical scope of the present disclosure. The constituent elements described in the above embodiments may be combined in any way within the scope of the disclosure.

The present disclosure is suitable for use in a small module used in a wireless communication device, a radar device, and the like using a millimeter-wave band.

What is claimed is:

1. An antenna-integrated module comprising:
   one or more semiconductor chips each having a silicon substrate, a metal layer stacked on a first surface of the silicon substrate, and one or more frequency converters;
   an insulating layer that surrounds the one or more semiconductor chips;
   a re-distribution layer that is stacked on a first surface of the insulating layer and on a first surface of the metal layer;
   one or more first antenna elements that are provided on the first surface of the metal layer with a first conductor pattern and that are connected to the one or more frequency converters, the one or more first antenna elements being disposed over the silicon substrate and not being disposed over the insulating layer surrounding the one or more semiconductor chips; and
   one or more second antenna elements that are provided over the insulating layer with a second conductor pattern on a first surface of the re-distribution layer stacked on the first surface of the insulating layer and that are connected to the one or more frequency converters, the one or more second antenna elements being disposed over the insulating layer surrounding the one or more semiconductor chips and not being disposed over the silicon substrate.

2. The antenna-integrated module according to claim 1, wherein
   at least one of (i) the one or more first antenna elements and (ii) the one or more second antenna elements has a differential configuration.

3. The antenna-integrated module according to claim 1, wherein
   the insulating layer is stacked on a first surface of a conductor plate.

4. The antenna-integrated module according to claim 1, wherein
   the one or more first antenna elements and the one or more second antenna elements are configured such that the one or more first antenna elements and the one or more second antenna elements radiate toward a second surface of the re-distribution layer.

5. The antenna-integrated module according to claim 1, wherein
   the one or more semiconductor chips each have one or more phase adjusting circuits that are connected to the one or more frequency converters.

6. The antenna-integrated module according to claim 1, wherein
   the one or more semiconductor chips each have one or more amplitude adjusting circuits that are connected to the one or more frequency converters.

7. The antenna-integrated module according to claim 1, wherein
   the semiconductor chips are disposed separately from each other; and
   the one or more second antenna elements are disposed between the semiconductor chips.

8. A radar device comprising:
   an antenna-integrated module; and
   a second substrate on which the antenna-integrated module is mounted,
   the antenna-integrated module including:
   one or more semiconductor chips each having a silicon substrate, a metal layer stacked on a first surface of the silicon substrate, and one or more frequency converters;
   an insulating layer that surrounds the one or more semiconductor chips;
   a re-distribution layer that is stacked on a first surface of the insulating layer and on a first surface of the metal layer;
   one or more first antenna elements that are provided on the first surface of the metal layer with a first conductor pattern and that are connected to the one or more frequency converters, the one or more first antenna elements being disposed over the silicon substrate and not being disposed over the insulating layer surrounding the one or more semiconductor chips; and
   one or more second antenna elements that are provided with a second conductor pattern on a first surface of the re-distribution layer stacked on the first surface of the insulating layer and that are connected to the one or more frequency converters, the one or more second antenna elements being disposed over the insulating layer surrounding the one or more semiconductor chips and not being disposed over the silicon substrate.

9. The radar device according to claim 8, wherein
   the insulating layer is stacked on a first surface of a conductor plate; and
   the second substrate has a third conductor pattern in a portion of the second substrate other than a portion facing the one or more first antenna elements and the one or more second antenna elements of the antenna-integrated module.

10. The radar device according to claim 8, wherein
    the second substrate has a fourth conductor pattern that is located in a portion facing the one or more first antenna elements and the one or more second antenna elements of the antenna-integrated module and the second substrate has a reflection plate that is located between the antenna-integrated module and the fourth conductor pattern in a portion facing the one or more first antenna elements and the one or more second antenna elements.

11. The radar device according to claim 8, wherein the second substrate has one or more phase adjusting circuits connected to the one or more frequency converters.

12. The radar device according to claim 8, wherein the second substrate has one or more amplitude adjusting circuits connected to the one or more frequency converters.

13. An antenna-integrated module comprising:
one or more semiconductor chips each having a silicon substrate, a metal layer stacked on a first surface of the silicon substrate, a plurality of frequency converters, and one or more external terminals;
an insulating layer that surrounds the one or more semiconductor chips;
a re-distribution layer that is stacked on a first surface of the insulating layer and on a first surface of the metal layer;
one or more first antenna elements that are provided on the first surface of the metal layer with a first conductor pattern and that are connected to a first part of the plurality of frequency converters, the one or more first antenna elements being connected to the part of the plurality of frequency converters without the one or more external terminals; and
one or more second antenna elements that are provided with a second conductor pattern on a first surface of the re-distribution layer stacked on the first surface of the insulating layer and that are connected to a second part of the plurality of frequency converters, the one or more second antenna elements being connected to the other part of the plurality of frequency converters via the one or more external terminals.

14. The antenna-integrated module according to claim 13, wherein
the antenna-integrated module is mounted on a second substrate of a radar device.

\* \* \* \* \*